(12) United States Patent
Yilmaz et al.

(10) Patent No.: US 9,256,311 B2
(45) Date of Patent: Feb. 9, 2016

(54) FLEXIBLE TOUCH SENSOR

(75) Inventors: Esat Yilmaz, Santa Cruz, CA (US); Steven Alan Laub, Atherton, CA (US); Jalil Shaikh, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 269 days.

(21) Appl. No.: 13/284,674

(22) Filed: Oct. 28, 2011

(65) Prior Publication Data

US 2013/0106441 A1    May 2, 2013

(51) Int. Cl.
| | |
|---|---|
| *G01R 27/26* | (2006.01) |
| *G06F 3/041* | (2006.01) |
| *G06F 3/0354* | (2013.01) |
| *G06F 3/044* | (2006.01) |
| *G01R 1/073* | (2006.01) |
| *G01R 31/28* | (2006.01) |

(52) U.S. Cl.
CPC .......... *G06F 3/0414* (2013.01); *G06F 3/03547* (2013.01); *G06F 3/044* (2013.01); *G01R 1/0735* (2013.01); *G01R 31/2889* (2013.01); *G06F 2203/0339* (2013.01); *G06F 2203/04112* (2013.01)

(58) Field of Classification Search
CPC ............ G06F 3/044; G06F 2203/0339; G06F 2203/04112; G06F 3/03547; G01R 1/0735; G01R 31/2889
USPC .................. 324/654, 658, 663; 345/173–175
See application file for complete search history.

(56) References Cited

U.S. PATENT DOCUMENTS

| | | | |
|---|---|---|---|
| 5,089,672 A * | 2/1992 | Miller | 200/61.43 |
| 5,729,249 A * | 3/1998 | Yasutake | 345/173 |
| 7,663,607 B2 * | 2/2010 | Hotelling et al. | 345/173 |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2002/0149572 A1 * | 10/2002 | Schulz et al. | 345/174 |
| 2007/0153548 A1 * | 7/2007 | Hamada | G02B 6/0036 362/615 |
| 2008/0129317 A1 * | 6/2008 | Oba | 324/663 |
| 2008/0129927 A1 * | 6/2008 | Hamada | G02B 6/0036 349/65 |
| 2008/0158183 A1 * | 7/2008 | Hotelling et al. | 345/173 |
| 2008/0165139 A1 * | 7/2008 | Hotelling et al. | 345/173 |
| 2008/0277259 A1 * | 11/2008 | Chang | 200/600 |
| 2008/0303782 A1 * | 12/2008 | Grant et al. | 345/156 |
| 2009/0002339 A1 * | 1/2009 | Reynolds et al. | 345/174 |

(Continued)

FOREIGN PATENT DOCUMENTS

WO    WO 2012/129247    9/2012

OTHER PUBLICATIONS

U.S. Appl. No. 61/454,936, filed Mar. 21, 2011, Myers.

(Continued)

*Primary Examiner* — Vincent Q Nguyen
*Assistant Examiner* — Raul Rios Russo
(74) *Attorney, Agent, or Firm* — Baker Botts L.L.P.

(57) ABSTRACT

In one embodiment, an apparatus include a substantially flexible substrate and a touch sensor disposed on the substantially flexible substrate. The touch sensor comprising drive or sense electrodes made of flexible conductive material configured to bend with the substantially flexible substrate.

20 Claims, 7 Drawing Sheets

(56) References Cited

U.S. PATENT DOCUMENTS

| | | |
|---|---|---|
| 2009/0219257 A1* | 9/2009 | Frey et al. .................. 345/173 |
| 2009/0315854 A1 | 12/2009 | Matsuo |
| 2010/0045614 A1* | 2/2010 | Gray et al. .................. 345/173 |
| 2010/0045620 A1* | 2/2010 | Long et al. .................. 345/173 |
| 2010/0156840 A1* | 6/2010 | Frey et al. .................. 345/174 |
| 2010/0308844 A1* | 12/2010 | Day et al. .................... 324/663 |
| 2011/0005845 A1* | 1/2011 | Hotelling et al. ........ 178/18.06 |
| 2011/0012793 A1* | 1/2011 | Amm et al. .................. 343/702 |
| 2011/0018556 A1* | 1/2011 | Le et al. ...................... 324/654 |
| 2011/0210935 A1* | 9/2011 | Chuang ....................... 345/174 |
| 2012/0038613 A1* | 2/2012 | Choi ............................ 345/211 |
| 2012/0074961 A1* | 3/2012 | Herrmann .................. 324/658 |
| 2012/0098785 A1* | 4/2012 | Tatelbaum et al. .......... 345/174 |
| 2012/0242588 A1 | 9/2012 | Myers |
| 2012/0242592 A1* | 9/2012 | Rothkopf et al. ............ 345/173 |
| 2012/0243151 A1 | 9/2012 | Lynch |
| 2012/0243719 A1 | 9/2012 | Franklin |
| 2012/0299865 A1* | 11/2012 | Yu ................................ 345/174 |
| 2013/0032414 A1* | 2/2013 | Yilmaz et al. ............ 178/18.06 |
| 2013/0076612 A1 | 3/2013 | Myers |
| 2013/0088671 A1* | 4/2013 | Drzaic ................ G02F 1/13452 |
| | | 349/106 |

OTHER PUBLICATIONS

U.S. Appl. No. 61/454,950, filed Mar. 21, 2011, Lynch.
U.S. Appl. No. 61/454,894, filed Mar. 21, 2011, Rothkopf.

\* cited by examiner

FLEXIBLE TOUCH SENSOR

TECHNICAL FIELD

This disclosure generally relates to touch sensors.

BACKGROUND

A touch-position sensor may detect the presence and location of a touch or the proximity of an object (such as a user's finger or a stylus) within a touch-sensitive area of the touch sensor overlaid on a display screen, for example. In a touch sensitive display application, the touch position sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch position sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A controller may process the change in capacitance to determine its position on the touch screen.

DESCRIPTION OF EXAMPLE EMBODIMENTS

Figure 1:
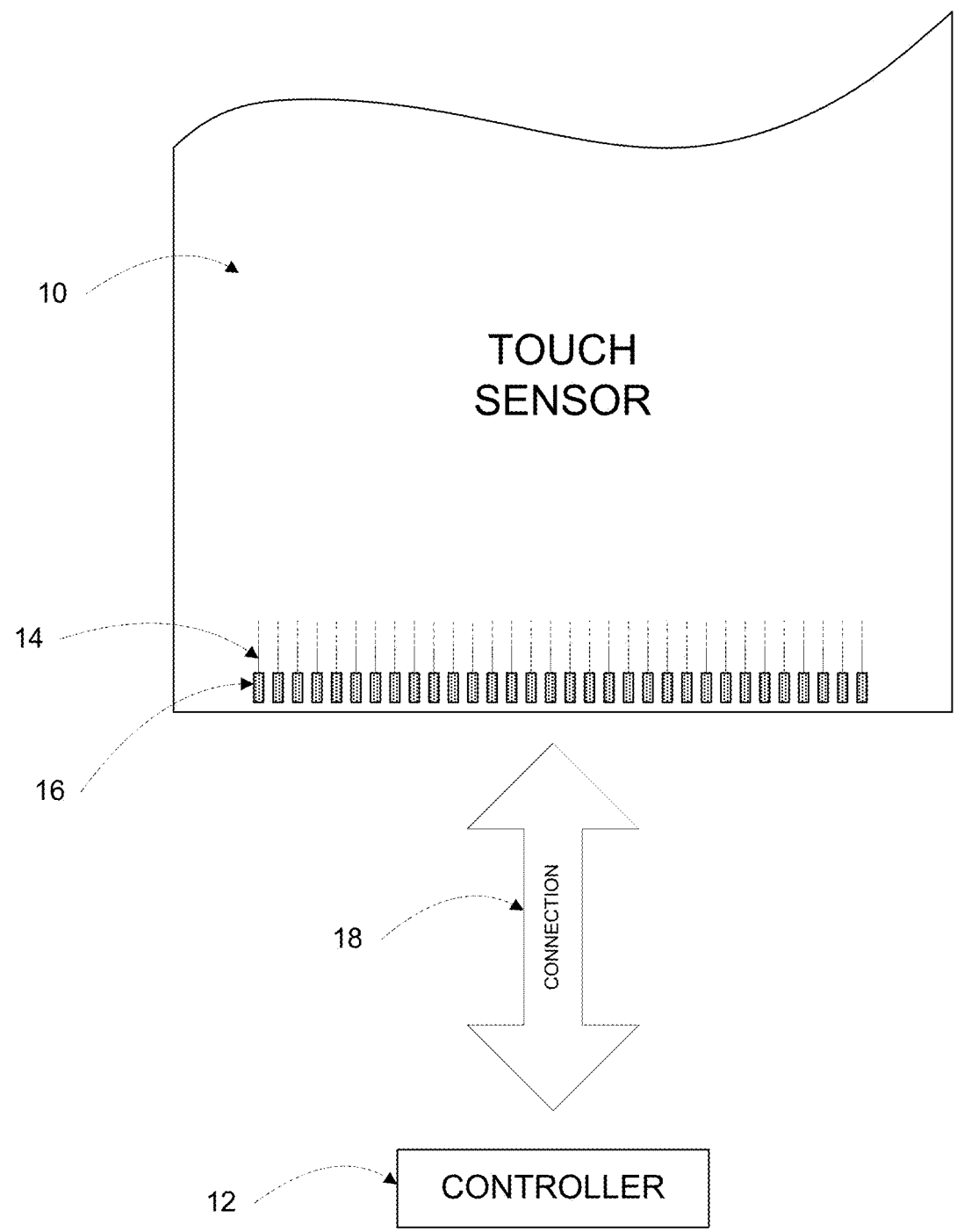
FIG. 1 illustrates an example touch sensor with an example controller.

FIG. 1 illustrates an example touch sensor 10 with an example controller 12. Herein, reference to a touch sensor may encompass a touch screen, and vice versa, where appropriate. Touch sensor 10 and controller 12 may detect the presence and location of a touch or the proximity of an object within a touch-sensitive area of touch sensor 10. Herein, reference to a touch sensor may encompass both the touch sensor and its controller, where appropriate. Similarly, reference to a controller may encompass both the controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy approximately 5% of the area of its shape. As an example and not by way of limitation, an electrode may be made of fine lines of metal or other conductive material (such as for example copper, silver, or a copper- or silver-based material) and the fine lines of conductive material may occupy approximately 5% of the area of its shape in a hatched, mesh, or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and controller 12 may measure the change in capacitance. By measuring changes in capacitance throughout the array, controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and controller 12 may measure the change in capacitance, for example, as a change in the amount of charge needed to raise the voltage at the capacitive node by a pre-determined amount. As with a mutual-capacitance implementation, by measuring changes in capacitance throughout the array, controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Controller 12 may detect and process the change in capacitance to determine the presence and location of the touch or proximity input. Controller 12 may then communicate information about the touch or proximity input to one or more other components (such one or more central processing units (CPUs) or digital signal processors (DSPs)) of a device that includes touch sensor 10 and controller 12, which may respond to the touch or proximity input by initiating a function of the device (or an application running on the device) associated with it. Although this disclosure describes a particular controller having particular functionality with respect to a particular device and a particular touch sensor, this disclosure contemplates any suitable controller having any suitable functionality with respect to any suitable device and any suitable touch sensor.

Controller 12 may be one or more integrated circuits (ICs)—such as for example general-purpose microprocessors, microcontrollers, programmable logic devices or arrays, application-specific ICs (ASICs)—on a flexible printed circuit (FPC) bonded to the substrate of touch sensor 10, as described below. Controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular controller having a particular implementation with particular components, this disclosure contemplates any suitable controller having any suitable implementation with any suitable components.

Tracks 14 of conductive material disposed on the substrate of touch sensor 10 may couple the drive or sense electrodes of touch sensor 10 to bond pads 16, also disposed on the substrate of touch sensor 10. As described below, bond pads 16 facilitate coupling of tracks 14 to controller 12. Tracks 14 may extend into or around (e.g. at the edges of) the touch-sensitive area(s) of touch sensor 10. Particular tracks 14 may provide drive connections for coupling controller 12 to drive electrodes of touch sensor 10, through which the drive unit of controller 12 may supply drive signals to the drive electrodes. Other tracks 14 may provide sense connections for coupling controller 12 to sense electrodes of touch sensor 10, through which the sense unit of controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a bond pad 16) at an edge of the substrate of touch sensor 10 (similar to tracks 14).

Bond pads 16 may be located along one or more edges of the substrate, outside the touch-sensitive area(s) of touch sensor 10. As described above, controller 12 may be on an FPC. Bond pads 16 may be made of the same material as tracks 14 and may be bonded to the FPC using an anisotropic conductive film (ACF). Connection 18 may include conductive lines on the FPC coupling controller 12 to bond pads 16, in turn coupling controller 12 to tracks 14 and to the drive or sense electrodes of touch sensor 10. This disclosure contemplates any suitable connection 18 between controller 12 and touch sensor 10.

Figure 2A:
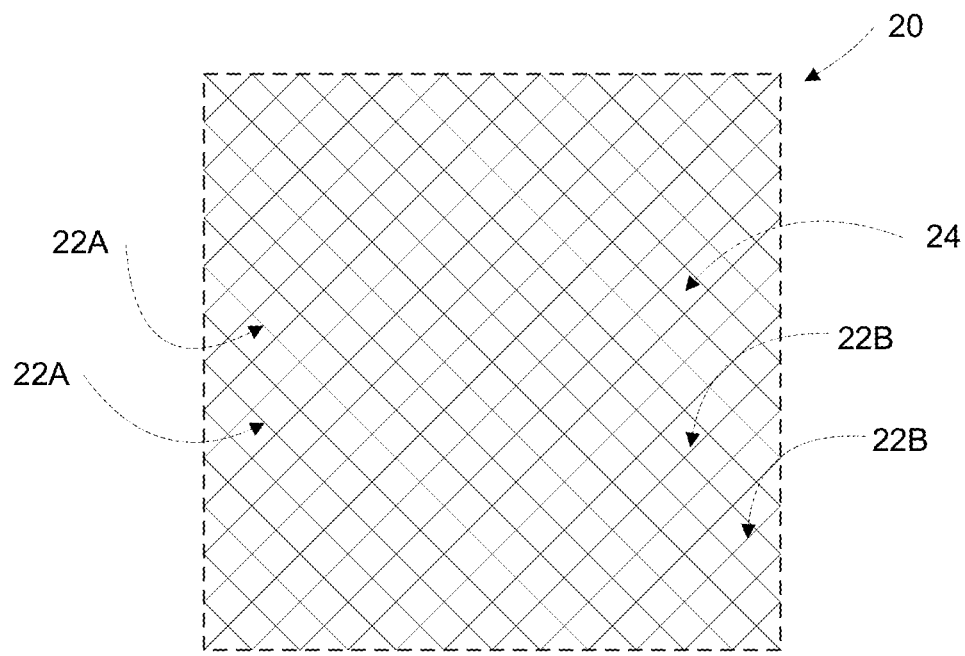
FIGS. 2A-2B illustrate two example mesh patterns of a touch-sensitive mesh layer.
Figure 2B:
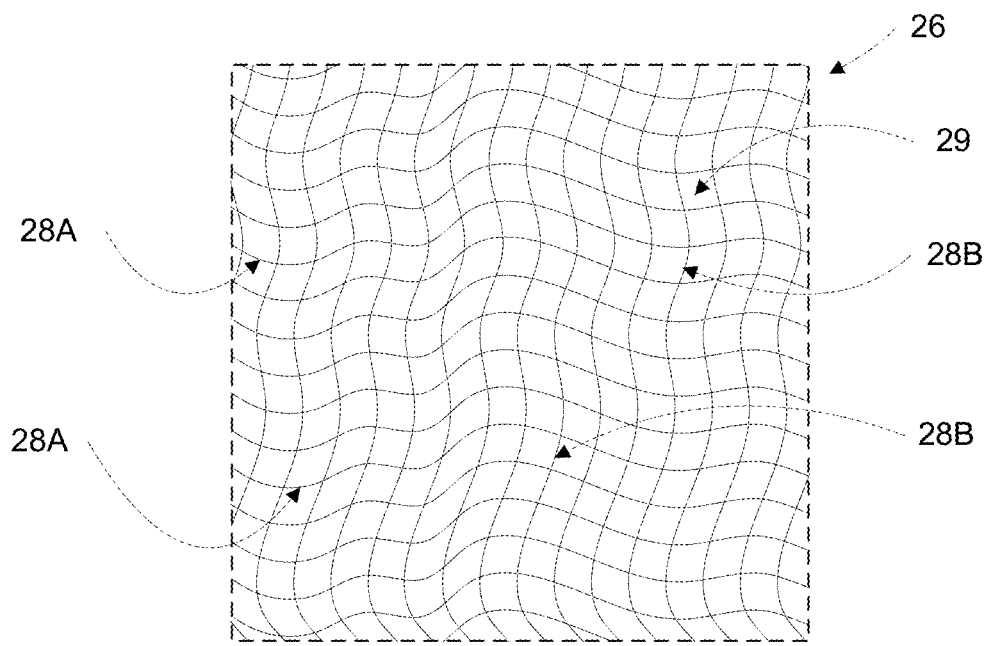
Figure 3:
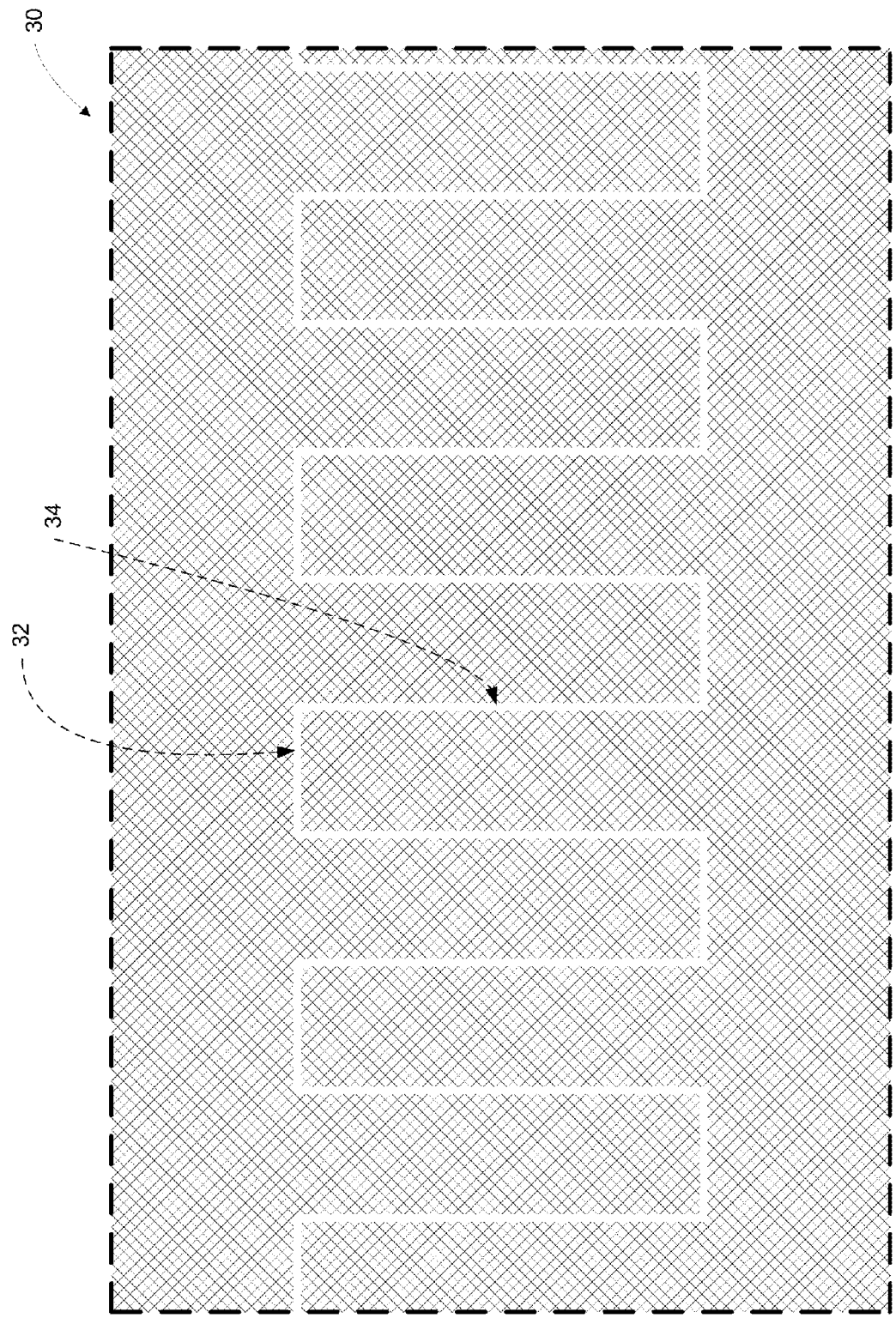
FIGS. 3-6 illustrate example cut patterns in the example mesh of FIG. 2A.

FIGS. 2A-2B illustrate two example mesh patterns of a touch-sensitive mesh layer. As discussed above, an electrode may be made of fine lines 22A-B of metal or other conductive material (e.g., copper, silver, or a copper- or silver-based material) and the lines 22A-B of conductive material may occupy the area of the electrode shape in a hatched, mesh, or other suitable pattern. In the example of FIG. 2A, an example mesh pattern 20 of a touch-sensitive mesh layer may be formed from substantially straight lines 22A-B of conductive material. Mesh pattern 20 may be formed using two sets 22A-B of substantially parallel lines of conductive material. Mesh pattern 20 may be made up of an array of diamond-shaped mesh cells 24 formed from substantially orthogonal intersections between lines 22A with lines 22B of conductive material. As an example and not by way of limitation, first set 22A and second set 22B of conducting lines may be disposed such that a total line density is less than approximately 10% of a surface area. Thus, the contribution of the conductive lines to the reduction of transmission of light through mesh pattern 20 may be less than approximately 10%. Accordingly, although conductive lines 22A-B may be opaque, the combined optical transmittance of electrodes formed using mesh pattern 20 may be approximately 90% or higher ignoring reduction in transmittance due to other factors such as the substantially flexible substrate material.

In the example of FIG. 2B, mesh pattern 26 may be formed from substantially non-linear conductive lines 28A-B. Non-linear line patterns 28A-B may be used to avoid long linear stretches of fine metal with a repeat frequency, reducing a probability of causing interference or moiré patterns. The non-linear pattern of the conductive lines 28A-B of mesh pattern 26 may disperse and hence reduce the visibility of reflections from conductive lines 28A-B when illuminated by incident light. As an example and not by way of limitation, each of conductive lines 28A-B of mesh pattern 26 may have a substantially sinusoidal shape. Mesh pattern 26 may be made up of an array of mesh cells 29 formed from non-orthogonal intersections between lines 26A with lines 26B of conductive material. Although this disclosure describes or illustrates particular mesh patterns, this disclosure contemplates any suitable mesh pattern formed using conductive lines with any suitable configuration.

FIGS. 3-6 illustrate example cut patterns in example mesh pattern of FIG. 2A. In the examples of FIG. 3-6, macro-features (e.g., electrodes) of the touch sensor may be formed through cuts made in a mesh pattern of lines of conductive material. A cut pattern 30 may be formed through horizontal cuts 32 and vertical cuts 34 with orthogonal intersections. In particular embodiments, cut pattern 30 with interdigitated substantially rectangular projections may be defined through horizontal cuts 32 and vertical cuts 34. As an example and not by way of limitation, cut pattern 30 with interdigitated projections may approximately correspond to projections of a sense electrode interdigitated with projections of a corresponding drive electrode. Using interdigitated electrode projections may increase a number of capacitive coupling edges between sense electrodes and corresponding drive electrodes. As another example, cut pattern 30 with interdigitated projections may approximately correspond to projections of a sense electrode interdigitated with projections of a corresponding drive electrode disposed on different layers. Using interdigitated electrode projections may increase a number of capacitive coupling edges between sense electrodes and corresponding drive electrodes.

Figure 4:
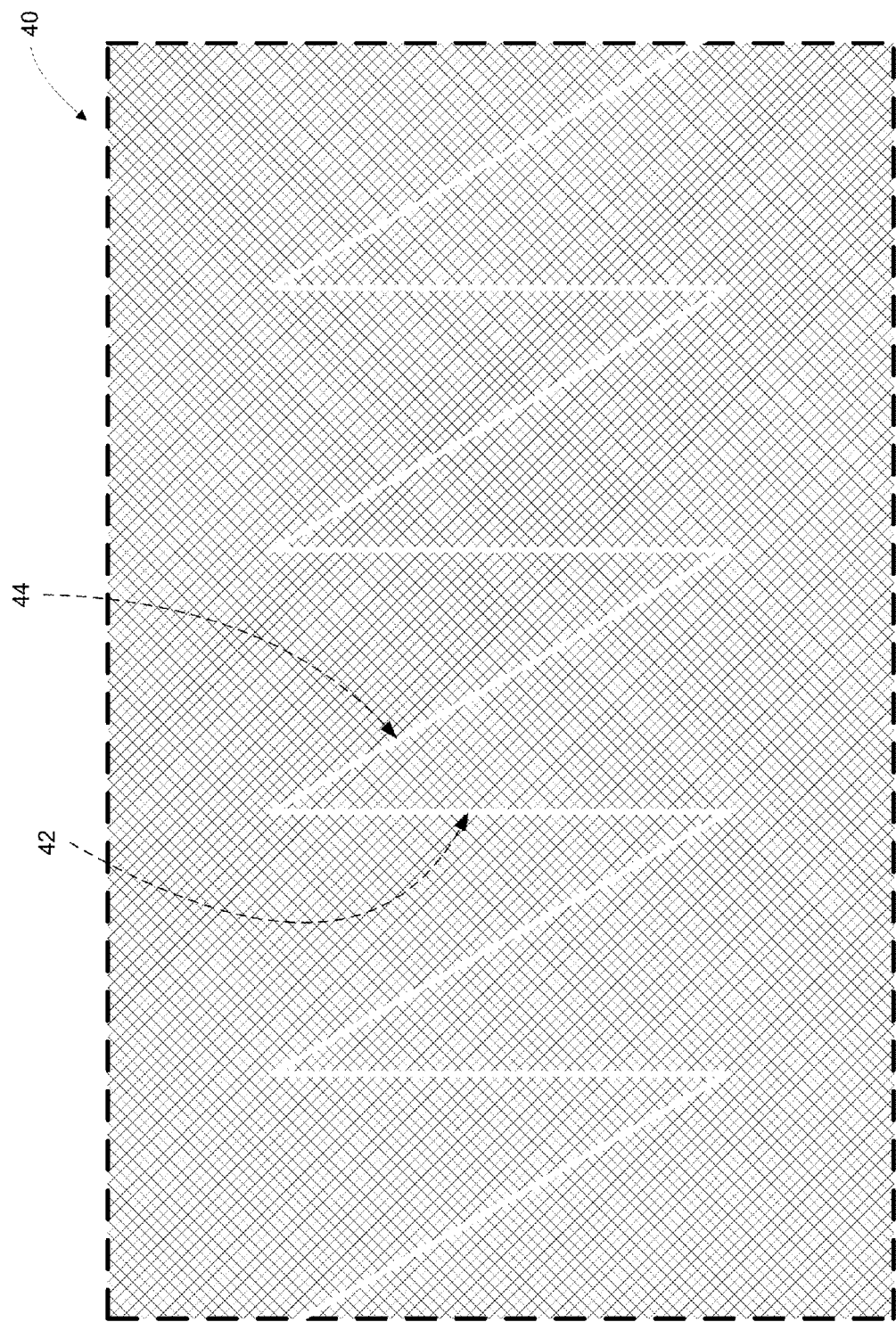
Figure 5:
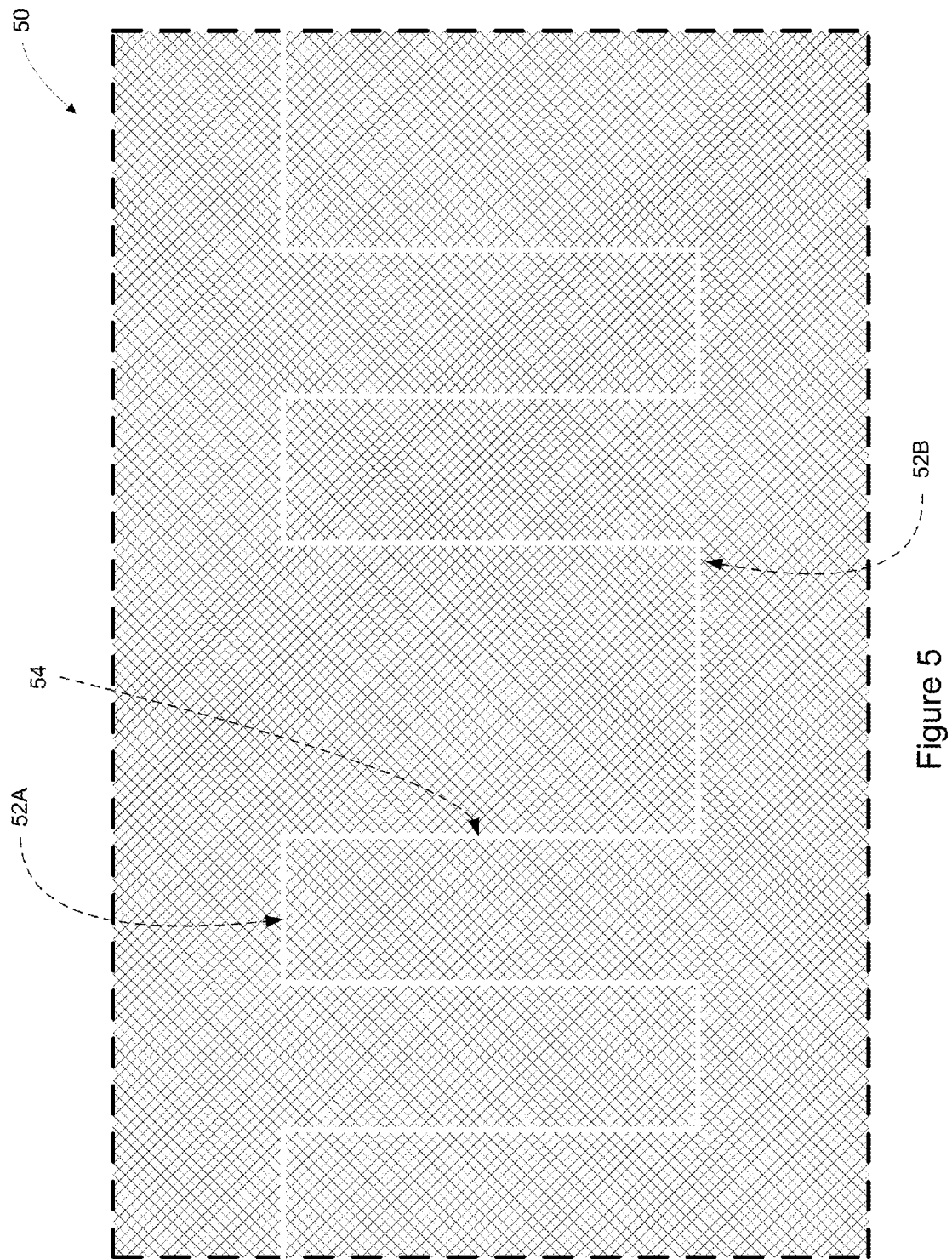
Figure 6:
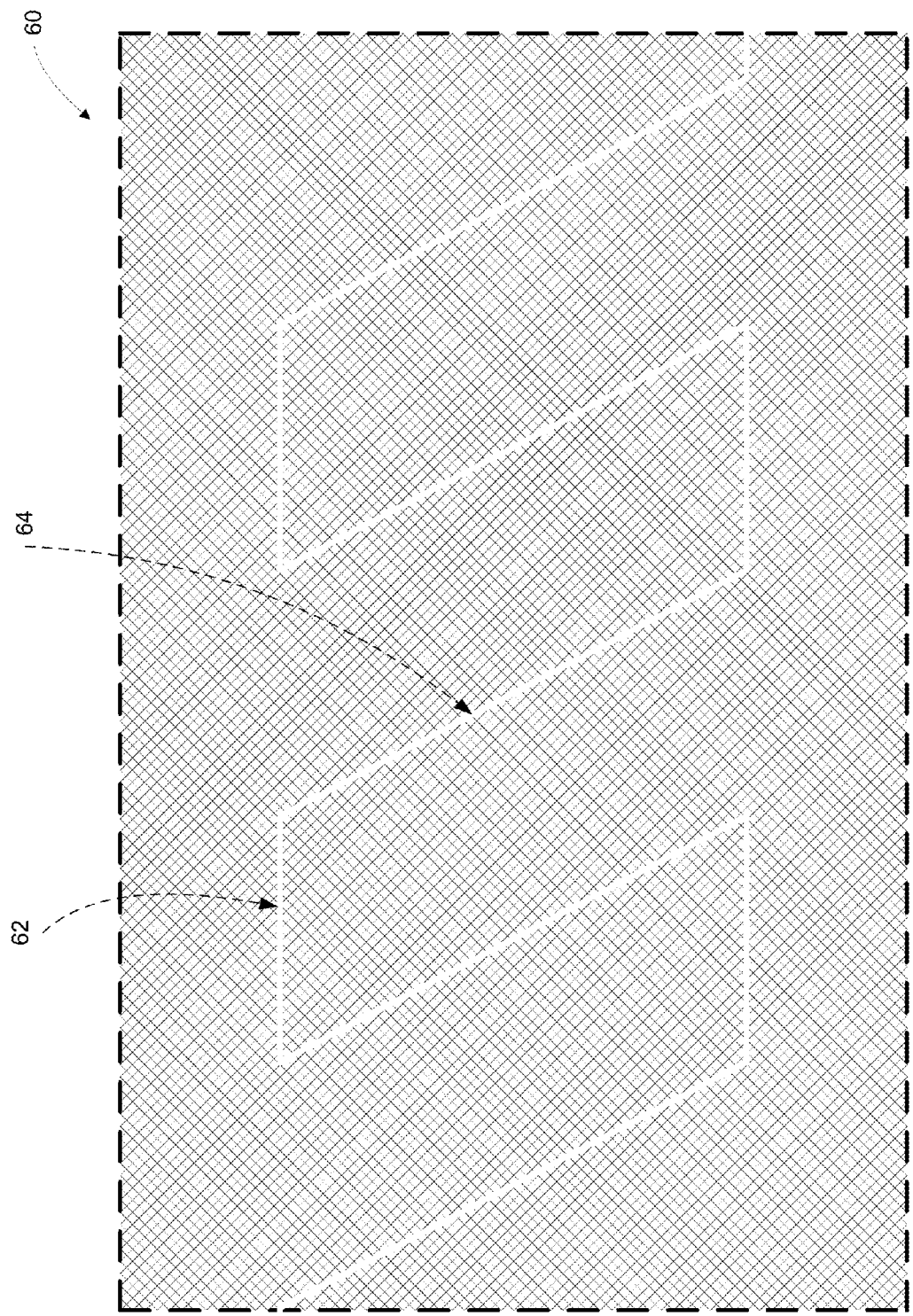

In the example of FIG. 4, a cut pattern 40 may be defined using vertical cuts 42 and angled cuts 44. Cut pattern 40 with interdigitated saw-tooth projections having non-orthogonal intersections may be defined through a substantially repeating pattern of vertical cuts 42 and angled cuts 44. As an example and not by way of limitation, cut pattern 40 may approximately correspond to electrodes using angled cuts 44 to increase a length of coupling edges between interdigitated projections of sense electrodes and corresponding drive electrodes. In the example of FIG. 5, horizontal cuts 52A-B and vertical cuts 54 may define a cut pattern 50 with alternating substantially rectangular projections. In particular embodiments, horizontal cuts 52A-B and vertical cuts 54 may define cut pattern 50 with projections having a width defined by the dimension of horizontal cuts 52A-B. A substantially rectangular projection may have a width defined by horizontal cuts 52A and another substantially rectangular projection may have a width defined by horizontal cuts 52B. As an example and not by way of limitation, cut pattern 50 may approximately correspond to alternating electrodes with differing widths, which may reduce interference patterns. In the example of FIG. 6, horizontal cuts 62 and angled cuts 64 may form a cut pattern 60 using non-orthogonal intersections to define interdigitated projections substantially in the shape of parallelograms. As an example and not by way of limitation, cut pattern 60 may approximately correspond to an electrode pattern with substantially parallelogram projections. Although this disclosure describes or illustrates particular cut patterns in a particular mesh pattern, this disclosure contemplates any suitable cut pattern made on any suitable mesh pattern including, but not limited to, bars and triangles.

In particular embodiments, micro-features (e.g. in-fill structures) of the touch sensor may be formed through cuts made in the mesh pattern of conductive material. Filling in gaps or voids using in-fill structures may reduce a number of areas with optical discontinuities visible when viewing an underlying display. In particular embodiments, gaps between adjacent electrodes or voids within electrodes may be substantially filled using in-fill structures of electrically isolated conductive material. The isolated in-fill shapes may serve to visually obscure an electrode pattern, while having a minimal impact on the fringing fields between adjacent electrodes. Therefore, using in-fill structures may have electric field distributions substantially similar to electric field distributions without in-fill structures. As an example and not by way of limitation, in-fill structures may be a series of electrically isolated squares formed using horizontal and vertical cuts in a mesh pattern. Although this disclosure describes or illustrates particular in-fill shapes having particular patterns, this disclosure contemplates any suitable in-fill shapes having any suitable patterns.

Figure 7:
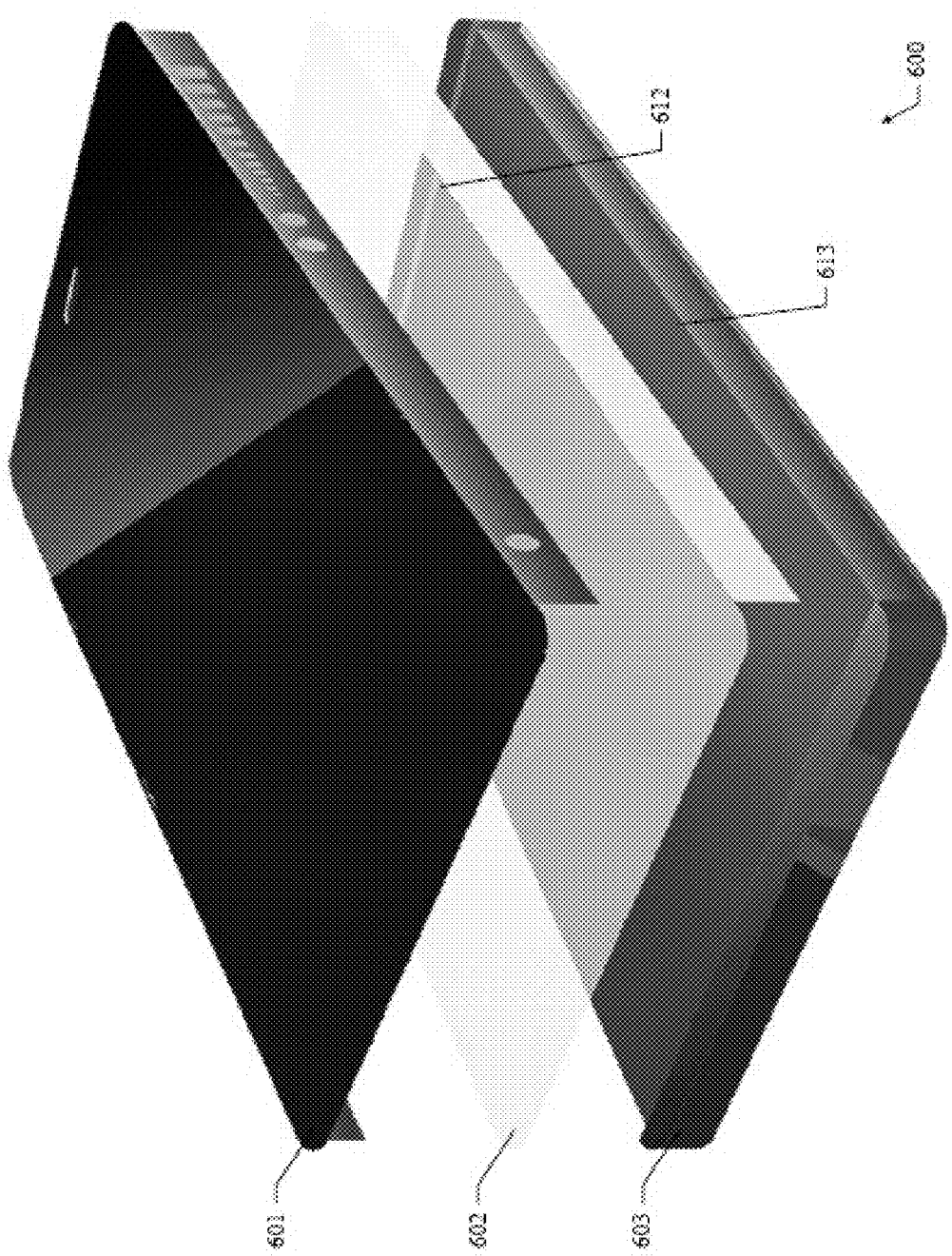
FIG. 7 illustrates an example mobile telephone that incorporates a flexible touch-sensitive apparatus.

FIG. 7 illustrates an example mobile telephone that incorporates a flexible touch-sensitive apparatus. In the example of FIG. 7, example mobile telephone 600 incorporates a touch-sensitive apparatus 612 wrapped around an example display 613. Substrate 602 may include or have attached to it tracking areas, which may include tracks providing drive and sense connections to and from the drive and sense electrodes of touch-sensitive apparatus 612. In particular embodiments, an electrode pattern of touch-sensitive apparatus 612 made from metal-mesh technology with a copper, silver, or other suitable metal mesh, as described above. Substrate 602 may have the electrode pattern disposed on a surface. Substrate 602 and the conductive material of the electrode pattern may be flexible, enabling the conductive material to wrap around the left and right edges of the surface to left-side and right-side surfaces. For sharper edges (e.g., with radii of less than 1 mm), the flexible conductive material of the electrode pattern may be thicker or wider at the sharper edges than at the flat portions of surfaces. In particular embodiments, the electrode pattern may wrap around an edge 603 of example mobile phone 600. In other particular embodiments, touch-sensitive apparatus 612 may be wrapped around a curved surface. The curved surface may be curved in one dimension or in two dimensions. As an example and not by way of limitation, touch-sensitive apparatus 612 may be wrapped over surfaces that are substantially perpendicular to each other or, if there is no substantial distinction between surfaces (such as, for example, a pebble-shaped or curved device), an angle of deviation between the surfaces of 45° or greater. Although this disclosure describes and illustrates a particular use of touch-sensitive apparatus 612 in a particular device, this disclosure contemplates any suitable use of touch-sensitive apparatus 612 in any suitable device.

Example display 613 may be a liquid crystal display (LCD), a light-emitting diode (LED) display, an LED-backlight LCD, or other suitable display and may be visible though cover panel 601 and substrate 602, as well as the electrode pattern disposed on substrate 602. Although this disclosure describes and illustrates a particular display and particular display types, this disclosure contemplates any suitable device display and any suitable display types.

Herein, reference to a computer-readable storage medium encompasses one or more non-transitory, tangible computer-readable storage media possessing structure. As an example and not by way of limitation, a computer-readable storage medium may include a semiconductor-based or other ICs (such, as for example, a field-programmable gate array (FPGA) or ASICs), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
   a substantially flexible substrate; and
   a touch sensor disposed on the substantially flexible substrate, the touch sensor comprising drive or sense electrodes made of flexible conductive material configured to bend with the substantially flexible substrate, wherein:

the flexible conductive material of the drive or sense electrodes comprises first and second conductive lines that electrically contact one another at an intersection to form a mesh grid; and the substantially flexible substrate and the touch sensor are configured to wrap around one or more edges of a display.

2. The apparatus of claim 1, wherein the touch sensor further comprises tracking disposed on the substantially flexible substrate configured to provide drive or sense connections to or from the drive or sense electrodes and configured to bend with the substantially flexible substrate.

3. The apparatus of claim 1, wherein the first and second conductive lines are made from one of carbon nanotubes, copper, silver, a copper-based material, or a silver-based material.

4. The apparatus of claim 1, wherein the touch sensor comprises:
a single-layer configuration with drive and sense electrodes disposed only on a first surface of the substantially flexible substrate; or
a two-layer configuration with drive electrodes disposed on the first surface of the substantially flexible substrate and sense electrodes disposed on a second surface of the substrate opposite the first surface.

5. The apparatus of claim 1, wherein the touch sensor is a mutual-capacitance touch sensor or a self-capacitance touch sensor.

6. The apparatus of claim 1, wherein the touch sensor further comprises electrically-isolated structures made of conductive material comprising a conductive mesh.

7. A device comprising:
a substantially flexible substrate;
a touch sensor disposed on the substantially flexible substrate, the touch sensor comprising a plurality of capacitive nodes formed from drive or sense electrodes made of flexible conductive material configured to bend with the substantially flexible substrate, wherein:
the flexible conductive material of the drive or sense electrodes comprises first and second conductive lines that electrically contact one another at an intersection to form a mesh grid;
the substantially flexible substrate and the touch sensor are configured to wrap around one or more edges of a display; and
one or more computer-readable non-transitory storage media embodying logic that is configured when executed to control the touch sensor.

8. The device of claim 7, wherein the touch sensor further comprises tracking disposed on the substantially flexible substrate configured to provide drive or sense connections to or from the drive or sense electrodes and configured to bend with the substantially flexible substrate.

9. The device of claim 7, wherein the first and second conductive lines are made from one of carbon nanotubes, copper, silver, a copper-based material, or a silver-based material.

10. The device of claim 7, wherein the touch sensor comprises:
a single-layer configuration with drive and sense electrodes disposed only on a first surface of the substantially flexible substrate; or
a two-layer configuration with drive electrodes disposed on the first surface of the substantially flexible substrate and sense electrodes disposed on a second surface of the substrate opposite the first surface.

11. The device of claim 7, wherein the touch sensor is a mutual-capacitance touch sensor or a self-capacitance touch sensor.

12. The device of claim 7, wherein the touch sensor further comprises electrically-isolated structures made of conductive material comprising a conductive mesh.

13. The apparatus of claim 1, wherein the first and second conductive lines are substantially orthogonal to one another.

14. The apparatus of claim 1, wherein the first and second conductive lines are non-linear.

15. The apparatus of claim 1, wherein the first and second conductive lines are made of fine lines of metal having a thickness of approximately 5 micrometers or less and a width of approximately 10 micrometers or less.

16. The device of claim 7, wherein the first and second conductive lines are substantially orthogonal to one another.

17. The device of claim 7, wherein the first and second conductive lines are non-linear.

18. The device of claim 7, wherein the first and second conductive lines are made of fine lines of metal having a thickness of approximately 5 micrometers or less and a width of approximately 10 micrometers or less.

19. The apparatus of claim 1, wherein the first and second conductive lines of the flexible conductive material of the drive or sense electrodes is wider at the one or more edges of the display.

20. The device of claim 7, wherein the first and second conductive lines of the flexible conductive material of the drive or sense electrodes is wider at the one or more edges of the display.

* * * * *